(12) United States Patent
Swiss et al.

(10) Patent No.: US 6,444,499 B1
(45) Date of Patent: Sep. 3, 2002

(54) METHOD FOR FABRICATING A SNAPABLE MULTI-PACKAGE ARRAY SUBSTRATE, SNAPABLE MULTI-PACKAGE ARRAY AND SNAPABLE PACKAGED ELECTRONIC COMPONENTS

(75) Inventors: Gary L. Swiss; Thomas P. Glenn, both of Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/539,314

(22) Filed: Mar. 30, 2000

(51) Int. Cl.[7] ............................................... H01L 21/44
(52) U.S. Cl. ...................... 438/127; 438/113; 438/613
(58) Field of Search .................................. 438/106, 107, 438/109, 110, 111, 112, 113, 121, 124, 125, 126, 127, 612, 613; 257/697, 778, 678, 684, 707, 693, 729, 701

(56) References Cited

U.S. PATENT DOCUMENTS

| | | | |
|---|---|---|---|
| 4,236,296 A | 12/1980 | Woolhouse et al. ........ 29/569 L |
| 4,237,601 A | 12/1980 | Woolhouse et al. ........... 29/583 |
| 4,961,821 A | 10/1990 | Drake et al. ................. 156/647 |
| 5,280,193 A * | 1/1994 | Lin et al. ..................... 257/723 |
| 5,284,792 A | 2/1994 | Forster et al. ............... 437/129 |
| 5,362,681 A | 11/1994 | Roberts, Jr. et al. ........ 437/226 |
| 5,436,203 A * | 7/1995 | Lin ............................. 29/841 |
| 5,473,512 A * | 12/1995 | Degani et al. .............. 174/256 |
| 5,766,982 A | 6/1998 | Akram et al. .................. 438/51 |
| 5,950,074 A * | 9/1999 | Glenn et al. ................. 438/118 |
| 5,962,917 A * | 10/1999 | Moriyama ................... 257/697 |
| 5,981,314 A | 11/1999 | Glen et al. .................. 438/127 |
| 5,990,545 A * | 11/1999 | Schueller et al. ........... 257/697 |
| 6,075,280 A * | 1/2000 | Yung et al. .................. 257/620 |
| 6,020,218 A * | 2/2000 | Shim et al. ................. 438/111 |
| 6,054,338 A | 4/2000 | Lee et al. .................... 438/110 |
| 6,221,751 B1 | 4/2001 | Chen et al. ................. 438/612 |
| 6,228,676 B1 * | 5/2001 | Glenn et al. ................ 438/107 |
| 6,268,654 B1 * | 7/2001 | Glenn et al. ................ 257/701 |

FOREIGN PATENT DOCUMENTS

| JP | 62015850 | * | 1/1987 | .......... H01L/23/52 |
|---|---|---|---|---|
| JP | 362015850 A | | 1/1987 | |

* cited by examiner

Primary Examiner—Wael Fahmy
Assistant Examiner—Brook Kebede
(74) Attorney, Agent, or Firm—Gunnison, McKay & Hodgson, L.L.P.; Philips J. McKay

(57) ABSTRACT

A method for forming a snapable multi-package array substrate, snapable multi-package array and snapable packaged electronic components is disclosed. The snapable multi-package substrate is formed with trenches that separate and define sections where individual packaged electronic components are fabricated in a snapable multi-package array, and where individual packaged electronic components are singulated from the snapable multi-package array of the invention by simply applying hand pressure to break or "snap" individual packaged electronic components apart.

45 Claims, 14 Drawing Sheets

METHOD FOR FABRICATING A SNAPABLE MULTI-PACKAGE ARRAY SUBSTRATE, SNAPABLE MULTI-PACKAGE ARRAY AND SNAPABLE PACKAGED ELECTRONIC COMPONENTS

FIELD OF THE INVENTION

The present invention relates generally to the packaging electronic components. More particularly, the present invention relates to the fabrication of a plurality of packaged electronic components on a single substrate.

BACKGROUND OF THE INVENTION

Virtually every business in the world has become dependent, directly or indirectly, on electronic components such as integrated circuits. In addition, electronic components have permeated our personal lives through their use in systems that control or contribute to almost every aspect of our day from coffee making to network computing. This application of electronic components to what were once seemingly unrelated fields has created a huge demand for these components in increasingly diverse industries and locations. Consequently, there has been a corresponding increase in demand for better methods and structures to package electronic components. This demand has made electronic component packaging one of the most critical and competitive markets in the electronics industry.

To stay competitive, those of skill in the art of electronic component packaging are constantly seeking better ways to provide protection of the extremely fragile electronic components from environmental elements and contamination while, at the same time, providing a solution which does not significantly increase the cost of the finished, packaged electronic component to the system manufacturer or the consumer. In one effort to reduce the cost of individual packaged electronic components, those of skill in the art have developed prior art methods and structures that allow electronic component packaging companies to fabricate multiple packaged electronic components from a single substrate, i.e., multiple packaged electronic components are created at once using a single substrate.

FIG. 1A is an enlarged top plan view of a prior art multi-package array substrate 13. Prior art multi-package array substrate 13 is one of several types of prior art substrates such as the prior art substrate discussed in U.S. Pat. No. 5,981,314 entitled "Near Chip Size Integrated Circuit Package", issued Nov. 9, 1999 to Thomas Glen, Roy Hollaway and Anthony Panczak, and assigned to the assignee of the present invention, which is incorporated in its entirety herein. In FIG. 1A, a plurality of lines 56 oriented in the vertical direction, as well as a plurality of lines 58 oriented in the horizontal direction are illustrated. Lines 56 and 58 were included to define the sections 12 where each individual packaged electronic component is to be formed. (For clarity, in FIG. 1A only two sections 12 are labeled). As shown in FIG. 1A, the periphery of each section 12 is defined by lines 56, 58. However, in an alternative embodiment, instead of lines 56, 58, alignment marks and/or fiducials were provided for aligning prior art multi-package array substrate 13 in subsequent processing steps discussed below. Consequently, in some prior art embodiments lines 56 and 58 were not solid lines. In addition, even when lines 56 and 58 were solid lines, lines 56 and 58 were typically only marks on a first surface 18 of prior art multi-package array substrate 13.

As shown in FIG. 1A and FIG. 1B, a dam 59 is typically formed on a first surface 18 of prior art multi-package array substrate 13, around the perimeter of prior art multi-package array substrate 13. Dam 59 encloses sections 12, yet does not extend into any of the sections 12.

FIG. 1B is a cross-sectional view along the line IB—IB of FIG. 1A of prior art multi-package array substrate 13. In practice, prior art multi-package array substrate 13 would also include conductive through-holes and other features which are not illustrated in FIG. 1B for clarity. As shown in FIG. 1B, dam 59 extends from first surface 18 to a predetermined height indicated by dashed line 68 above first surface 18 thereby defining a pocket which can be filled with encapsulant as described in more detail below.

Referring back to FIG. 1A, each section 12 of prior art multi-package array substrate 13 typically has a plurality of metallizations 22 formed on first surface 18 of prior art multi-package array substrate 13. In addition, a plurality of contacts (not shown) formed on metallizations 22 and a plurality of conductive through-holes (not shown) formed through prior art multi-package array substrate 13 could also be included but are not shown in FIG. 1A and FIG. 1B for simplicity and to avoid detracting from the discussion at hand.

Metallizations 22 are typically formed using conventional techniques such as by forming a conductive layer on first surface 18 and then by masking and etching the conductive layer. Conductive through-holes (not shown in FIG. 1A and FIG. 1B) can also be formed using conventional techniques such as by drilling through-holes in prior art multi-package array substrate 13 and then plating the drilled through-holes with a conductive metal such as copper.

FIGS. 2A and 2B are cross-sectional and top plan views, respectively, of an exemplary section 12 of substrate 13 (FIG. 1A) further along in processing. As shown in FIG. 2A, a first surface 32 of an electronic component such as an integrated circuit (IC) chip 30 is typically mounted to first surface 18 of prior art multi-package array substrate 13 by a layer of adhesive 34. As shown in FIG. 2B, IC chip 30 is typically mounted to section 12 in a location central to metallizations 22. Also shown are bonding pads 38 located on a second surface 36 of IC chip 30. Bonding pads 38 are typically electrically connected to corresponding contacts 23 by bond wires 40, made of gold or aluminum for example, using conventional wire bonding techniques.

In an alternative prior art embodiment (not shown) instead of mounting first surface 32 of IC chip 30 to first surface 18 of prior art multi-package array substrate 13 and electrically connecting bonding pads 38 to contacts 23 and metallizations 22 using bond wires 40 as illustrated in FIGS. 2A and 2B, IC chip 30 is mounted to substrate 13 using a flip chip interconnection. In this prior art embodiment (not shown), second surface 36 of IC chip 30 is placed adjacent first surface 18 of substrate 13 and bonding pads 38 are electrically connected to contacts 23 and metallizations 22 directly, for example, by solder. An under fill material is then applied to fill the space between IC chip 30 and substrate 12 and also to encapsulate the flip chip interconnection between bonding pads 38 and metallizations 22.

FIG. 2C is a cross-sectional view of an exemplary section 12 further along in processing. As shown in FIG. 2C, a layer of encapsulant 42 is applied over the entire assembly. In particular, layer of encapsulant 42 covers IC chip 30 including bonding pads 38, bond wires 40, contacts 23, metallizations 22 and the remaining exposed first surface 18 of prior art multi-package substrate 13. Typically, layer of encapsulant 42 is formed of an electrically insulating encapsulant and can be laser marked for product identification using conventional laser marking techniques. Layer of encapsulant 42 is typically applied as a liquid and then dries, or is cured, to a hardened solid.

Referring back to FIGS. 1A and 1B, and in particular to FIG. 1B, layer of encapsulant 42 is applied by filling the pocket defined by dam 59 with encapsulant. Dam 59 prevents layer of encapsulant 42 from flowing off first surface 18 of prior art multi-package substrate 13. Typically, dam 59 has a height indicated by dashed line 68 above first surface 18 greater than or equal to the height of upper surface 48 of layer of encapsulant 42 (FIG. 2C) above first surface 18.

As also shown in FIG. 2C, interconnection balls 28, typically eutectic solder balls, are attached to contacts 27 using conventional techniques. FIG. 2D is a bottom plan view of the exemplary section 12 of prior art multi-package substrate 13 of FIG. 2C. As shown in FIG. 2D, interconnection balls 28 are typically arranged in an array thus forming a ball grid array. In alternative prior art embodiments, contacts 27 form interconnection pads for electrical interconnection with other components and interconnection balls 28 are not formed. In other prior art embodiments, the interconnection balls or pads can be arranged adjacent Ad the perimeter of section 12, i.e. can be arranged near lines 56 and/or lines 58, instead of being arranged in an array fashion as in FIG. 2D.

Once applied, layer of encapsulant 42 is either heat cured, UV cured or left to harden by methods well known in the art. FIG. 2E is an overhead plan view of a prior art multi-package array 200. As shown in FIG. 2E, once layer of encapsulant 42 hardens, a plurality of packaged electronic components 10 and 10A are created in a multi-package array 200 including prior art packaged electronic components 10 and 10A.

Fabricating a plurality of packaged electronic components 10 and 10A simultaneously (in contrast to individually) from a single prior art multi-package array substrate 13, by the prior art methods discussed above, advantageously reduces handling costs and thereby reduces the cost of fabricating each individual packaged electronic component 10 and 10A. However, the individual packaged electronic components 10 and 10A must still be separated or "sigulated" from multi-package array 200 before they can be put to use.

FIG. 3A, FIG. 3B, and FIG. 3C illustrate a typical prior art method for the singulation of individual packaged electronic components 10 and 10A from a multi-package array 200. FIG. 3A is an enlarged cross-sectional view of a prior art multi-package array 200 as would be seen looking along line IIIA—IIIA of FIG. 2E.

Referring to FIG. 3A, multi-package array 200 includes a prior art multi-package substrate 13 having a plurality of sections 12 and 12A. After singulation, a packaged electronic component 10 and 10A is formed from each section 12 and 12A, respectively. Referring to an exemplary section 12A of the plurality of sections 12, metallizations 22 and 26 are formed on first and second surfaces 18 and 20, respectively. Corresponding metallizations 22 and 26 are electrically connected to one another by conductive through-holes 14. Contacts 23 and 27 are formed on corresponding metallizations 22 and 26, respectively. A solder mask 39 is placed over portions of second surface 20 and metallizations 26 but does not cover contacts 27.

Electronic components such as integrated circuits 30 and 30A, sometimes called IC chips, are attached to first surface 18 of sections 12 and 12A, respectively by adhesive 34. Bond pads 38, sometimes called bonding pads, are electrically connected to corresponding a-contacts 23 by corresponding bond wires 40.

As discussed above, a hardened layer of encapsulant 42 covers integrated circuits 30 and 30A including bond pads 38, bond wires 40, contacts 23, metallizations 22 and the remaining exposed first surface 18 of substrate 13.

As shown in FIG. 3B, to begin the prior art singulation process, prior art multi-package array 200 is placed upside down on tape 332 such that layer of encapsulant 42 adheres to a tape 332 and fiducials 345 are extended upwards and are exposed.

Tape 332 supports array 200 during sawing and is necessitated by the fact that, using prior art methods, a saw blade 322 cuts completely through substrate 13 and layer of encapsulant 42 as discussed in more detail below. Tape 332 is typically a sticky film or tape known to those of skill in the art as "blue tape". Disadvantageously, the use of tape 332 not only adds the cost of the tape itself to the process, but also the additional equipment required to apply and remove tape 332 and the time involved doing so.

Prior art multi-package array 200 is then singulated by cutting from backside surface 300B using fiducials 345 as a reference. FIG. 3B is a cross-sectional view of prior art multi-package array 200 of FIG. 2E and FIG. 3A being cut from backside surface 300B. Saw blade 322 is aligned with multi-package array 200. Typically, optical or mechanical alignment systems (not shown), which are well known to those of skill in the art, align saw blade 322 to array 200. Saw blade 322 has a thickness 370. Thickness 370 ranges from 3 to 14 mils and is typically on the order of 9 to 12 mils (note, a mil is defined as $\frac{1}{1000}$ of an inch herein). Saw blade 322 is then carefully aligned so that prior art multi-package array substrate 13 and layer of encapsulant 42 are cut along peripheries 56 of sections 12 and 12A (e.g., see lines 56, 58 of FIG. 1A discussed above) and packaged electronic components 10 and 10A, respectively, are singulated. As seen in FIG. 3B, an exemplary packaged electronic component 10A includes section 12A and the attached integrated circuit 30A.

After singulation, packaged electronic components 10 must be washed, typically with de-ionized water or solvent, to remove particulates of debris 366 (FIG. 3B). Disadvantageously, the washing process often leaves solder balls 28 (FIG. 3A) tarnished which can interfere with the conductivity of solder balls 28. In addition, de-ionized water is costly and solvents can be an environmental hazard requiring special permits and disposal mechanisms.

Next, packaged electronic components 10 are removed from tape 332 and inverted by a pick and place machine (not shown). Pick and place machines are well known in the art and come in several models from various makers and/or distributors.

A pick and place machine (not shown) then attaches to layer of encapsulant 42 of packaged electronic component 10A and removes packaged electronic components 10A for shipment wrapping or further processing by methods well known to those of skill in the art. The other packaged electronic components 10 are then similarly removed and processed.

The prior art sigulation process discussed above is extremely complicated, labor intensive and difficult to perform correctly. The process also involves highly specialized equipment such as optical alignment equipment, specialized saws, saw controls, pick and place machines, blue tape, and de-ionized water or solvents. This specialized equipment is expensive, bulky, typically not mobile, and requires skilled operators. Consequently, using prior art methods and structures, the singulation process must be performed at the packaging factory. This in turn means that each packaged electronic component must be shipped separately and wrapped separately, thus driving up the cost of each packaged electronic component, increasing the probability of defective units by increasing handling operations and driving down the efficiency of the process.

In contrast, systems manufacturers, the typical customers for packaged electronic components, desire packages that adequately protect the electronic components and allow these components to be shipped in bulk, cheaply and safely, to remote assembly locations. The systems manufactures further desire packaged electronic components that can be stored, efficiently and economically, for long periods of time and can then be assembled directly into the systems, at the assembly site, without significant further processing of the packaged electronic components. As discussed above, prior art methods, especially prior art singulation methods, do not meet this need.

In addition to failing to meet the needs of the customer, prior art singulation methods also waste expensive resources, including substrate material, blue tape, de-ionized water, solvents and time. As discussed above, saw blade 322 has thickness 370 and saw blade 322, like any saw, cuts unevenly leaving a trough or kerf 375 with relatively rough edges 375A and 375B (FIG. 3C). Consequently, kerf 375 has an associated kerf thickness 372 that is typically even greater than saw thickness 370 and is often on the order of 3 to 14 mils.

FIG. 3C is an enlarged view of section 380 of FIG. 3B showing kerf 375, of kerf thickness 372, including kerf sides 375A, 375B, and kerf bottom 375C. Each cut in multi-package array 200 results in a kerf 375, with an associated kerf thickness 372 that runs completely through prior art multi-package substrate 13 and layer of encapsulant 42. Therefore, using prior art methods, blue tape 122 is required to hold prior art multi-package array substrate 13 together during the singulation process. In addition, space must be left between packaged electronic components 10 on multi-package array 200 to allow for cutting and the resulting kerf 379. Disadvantageously, this area allocated for the cutting process means that fewer packaged electronic components 10 and 10A can be formed on each multi-package array 200 and the cost of each packaged electronic component 10 and 10A is increased.

The prior art methods discussed above also result in the loss of expensive substrate and encapsulant material. The material is lost when kerfs 375 are cut by saw blade 322. The material lost with each cut is equal to kerf thickness 372 times the length (not shown) of kerf 375. In a typical prior art embodiment, kerf 375 is on the order of 2 inches to 78.5 millimeters long. Since each packaged electronic component 10 and 10A is typically cut on all four sides, the amount of material lost is considerable. This fact also adds significantly to the cost of each individual packaged electronic component 10 and 10A.

As shown in FIG. 3B, saw blade 322, and the sawing process in general, creates particulates of debris 366 during the singulation process. Particulates of debris 366 are disadvantageous since they can contaminate packaged electronic components 10 and 10A. In addition, during the sawing process, the integrity of packaged electronic components 10 and 10A is often compromised due to the stress created by the sawing process and/or improper alignment of saw blade 322. Consequently, it often happens that the sawing process first compromises the integrity of packaged electronic components 10 and 10A and then provides the contamination in the form of particulates of debris 366. This is clearly a disadvantage of the prior art methods.

Another prior art method for sigulation (not shown), uses a LASER to cut along lines 56 and 58 and thereby singulate packaged electronic components 10 and 10A. Using the LASER method, far fewer particulates of debris 366 are created. However, space must still be allocated for the cutting process which means that fewer packaged electronic components 10 and 10A can be formed on each multi-package array 200 and the cost of each packaged electronic component 10 and 10A in increased. In addition, the cost of the specialized LASER equipment, along with the trained operators to run the equipment, is significant and often economically prohibitive. The LASER equipment is also typically not portable. This means the singulation process must still be performed at the packaging location. Using the prior art LASER singulation method also requires very careful alignment and package integrity is often compromised by a misaligned LASER. This situation also dictates that singulation be performed at the packaging plant rather than in the field.

The labor, preparation and machinery involved in the prior art singulation process, as well as the waste and other problems associated with the prior art process, make singulation using prior art methods one of the most expensive and wasteful steps in the packaging process. What is needed is a method and structure for packaging electronic components that allows for singulation of individually packaged electronic components from a multi-package array that is simple, economical, does not require specialized singulation equipment and allows for singuation onsite or in the field.

SUMMARY OF THE INVENTION

In accordance with the present invention, a snapable multi-package substrate is formed with trenches that separate and define sections where individual packaged electronic components are fabricated in a snapable multi-package array. Individual packaged electronic components are sigulated from the snapable multi-package array of the invention by simply applying hand pressure to break or "snap" individual packaged electronic components apart.

The singulation process using the method and structure of the invention does not require any specialized equipment such as optical alignment devices, specialized saws and saw controls or pick and place machines. The singulation process using the method and structure of the invention does not require skilled operators. Consequently, singulation, using the method and structure of the invention, can be performed anywhere and packaged electronic components can be shipped in snapable multi-package arrays, stored in snapable multi-package arrays for long periods of time, and then be singulated and assembled directly into the systems, at the assembly site, without significant further processing of the snapable packaged electronic components.

In addition, the waste associated with prior art singulation methods is eliminated. With no saw or saw blade, and no cuts or kerfs completely through the substrate and layer of encapsulant, there is no concern about saw blade thickness and kerf or kerf thickness. Consequently, no space must be left between packaged electronic components on snapable multi-package array to allow room for cutting and the resulting kerfs. This means more packaged electronic components can be formed on each snapable multi-package array and the cost of each packaged electronic component is decreased.

In addition, using the method and structure of the invention for singulation, no blue tape is required and no material is lost because there are no kerfs cut completely through the substrate and encapsulant by a saw blade. Since each packaged electronic component is typically cut on all four sides using prior art methods, the amount of material saved using the structure and method of the invention is considerable.

In addition, since the singulation process using the method and structure of the invention does not involve a saw, there are no alignment problems or stresses associated with sawing and no particulates of debris are created. Consequently, using the method and structure of the invention, there is less chance to contaminate the packaged electronic components and no washing is required or de-ionized water or solvents.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with the present invention, a snapable multi-package substrate 413 (FIG. 4A) is formed with trenches 456, 458 (FIG. 4A) that separate and de fine sections 412 (FIG. 4A) where individual packaged electronic components 410A, 410B, 410C (FIG. 4E) are below.

Figure 4A:
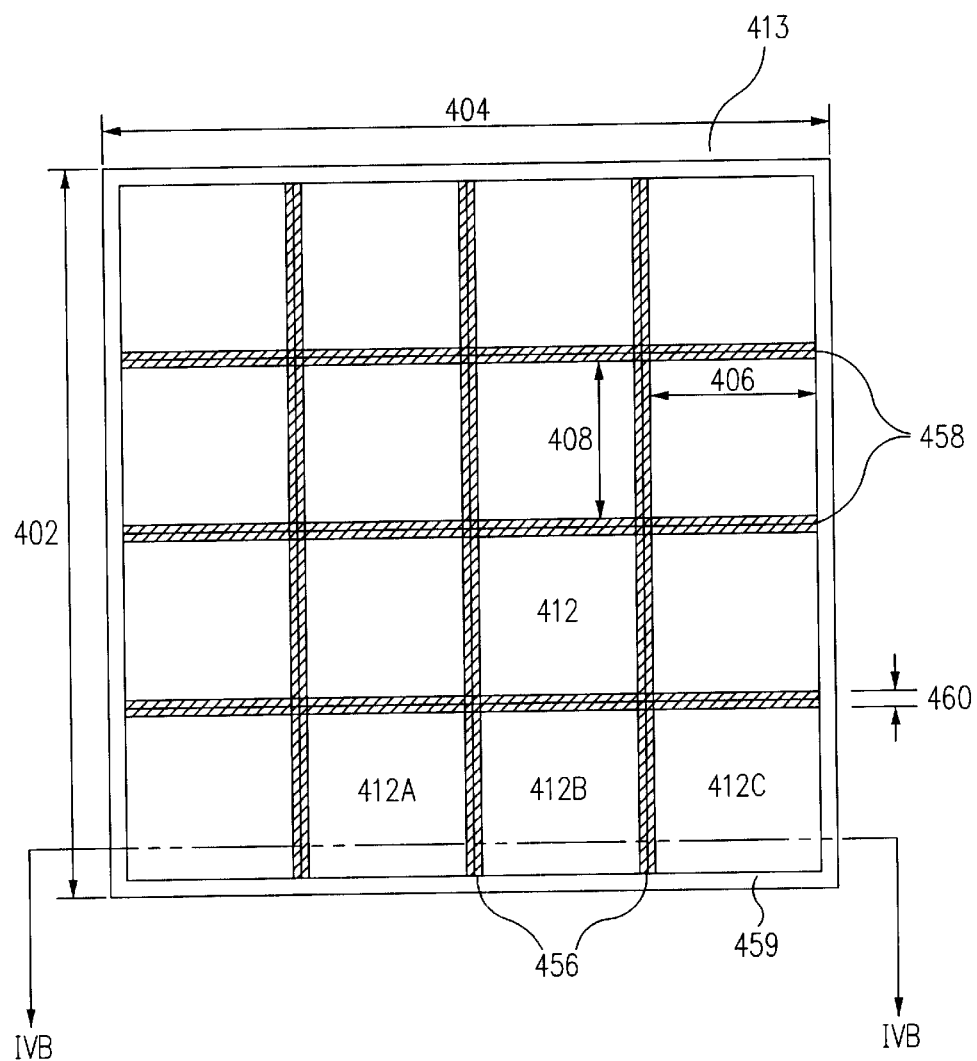
FIG. 4A is an enlarged top plan view of a snapable multi-package array substrate in accordance with the invention.
Figure 4B:
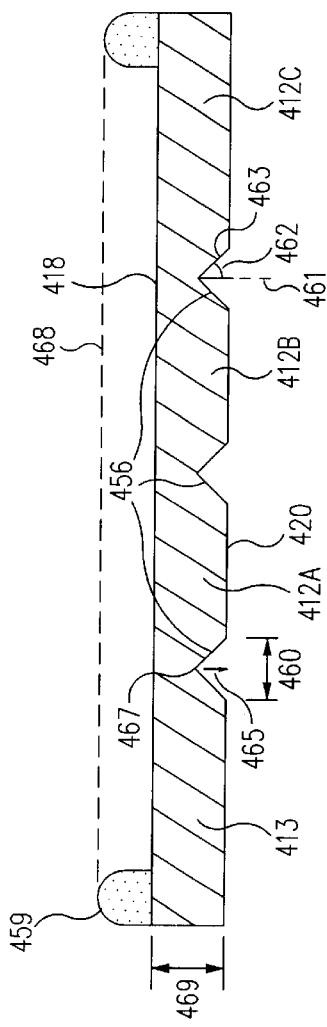
FIG. 4B is an enlarged cross-sectional view along the line IVB—IVB of FIG. 4A of a snapable multi-package array substrate in accordance with the invention.

FIG. 4B also includes a side view of trenches 456. Trenches 456 and 458 (FIG. 4A) are identical except that, in one embodiment, trenches 456 run perpendicular to trenches 458 in first surface 420 of snapable multi-package array substrate 413. Consequently, the following discussion is equally applicable to both trenches 456 and 458. As can be seen in FIG. 4B, in one embodiment, trenches 456 are generally triangular in shape with a base width 460 and a side 463 at an angle 462 from a line 461 that runs perpendicular to first surface 420 of snapable multi-package array substrate 413. Trenches 456 also have a depth 465 equal to the distance from surface 420 to apex point 467 (also see FIG. 4D).

In one embodiment, snapable multi-package array substrate 413 has a thickness 469 in the range of approximately sixteen mils to eighty mils. In one embodiment, trenches 456 have a base width 460 in the range of approximately two mils and a depth 465 in the range of approximately one mil. In one embodiment, angle 462 is in the range of approximately five degrees to forty-five degrees.

The values given above are approximate and are given by way of example only. In light of the disclosure presented herein, those of skill in the art will recognize that an almost infinite range of values for thickness 469, base width 460, depth 465 and angle 462 can be employed depending on the specific application, the thickness 469 of snapable multi-package array substrate 413 and numerous other factors. For instance, if snapable multi-package array substrate 413 is formed by a high temperature, co-fired process, depth 465 of trenches 456 and 458 is typically equal to fifty percent of thickness 469 of snapable multi-package array substrate 412. However, if snapable multi-package array substrate 413 is formed by a low temperature, co-fired process, depth 465 of trenches 456 and 458 is typically in the range of 50 microns.

In addition, the generally triangular shape of trenches 456 and 458 is associated with one embodiment of the invention where trenches 456 and 458 are scored into snapable multi-package array substrate 413. Other methods of forming trenches 456 and 458 would result in other shapes such as substantially oval or rectangular. These shapes are also suitable for use with the method and structure of the present invention and the inventors do not wish to be bound to any one particular shape for trenches 456 and 458.

Figure 4C:
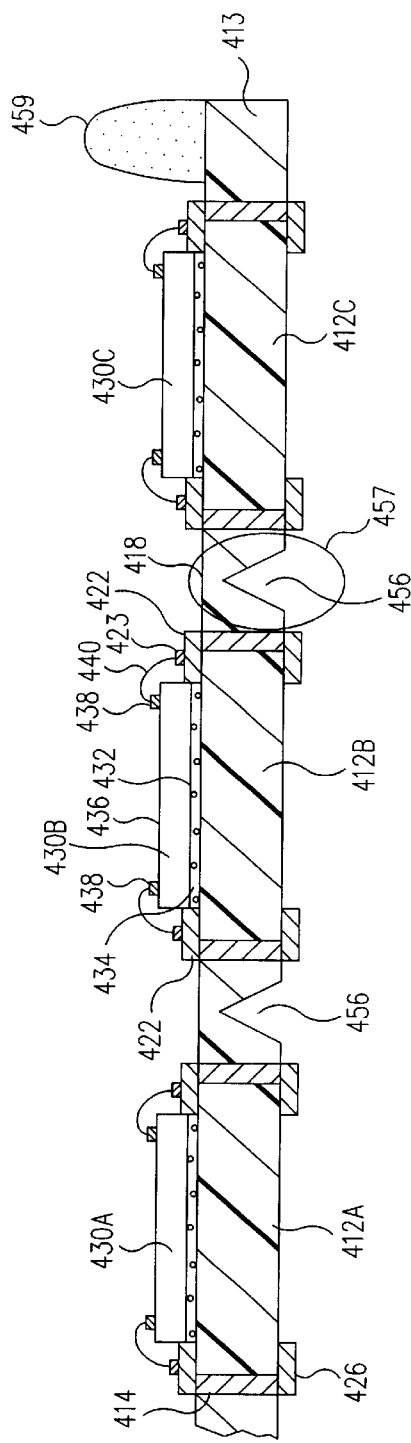
FIG. 4C is an enlarged cross-sectional view of three sections of the snapable multi-package array substrate of FIG. 4B further a long in processing in accordance with the invention.

FIG. 4C is a cross-sectional view of sections 412A, 412B and 412C further along in processing. As shown in FIG. 4C, the first surface 432 of an electronic component such as integrated circuit (IC) chips 430A, 430B, or 430C is typically mounted to second surface 418 of snapable multi-package array substrate 413 by a layer of adhesive 434. IC chips 430A, 430B and 430C are typically mounted to a section 412A, 412B or 412C, respectively, in a location central to metallizations 422. Also shown are bonding pads 438 located on a second surface 436 of IC chips 430A, 430B and 430C. Bonding pads 438 are typically electrically connected to corresponding contacts 423 by bond wires 440, made of gold or aluminum for example, using conventional wire bonding techniques. FIG. 4C also shows electrically conductive vias 414 and first surface metallizations 426.

In an alternative embodiment (not shown) instead of mounting first surface 432 of IC chip 430A, 430B, or 430C to second surface 418 of snapable multi-package array substrate 413 and electrically connecting bonding pads 438 to metallizations 422 using bond wires 440 as illustrated in FIG. 4C, IC chips 430A, 430B and 430C are mounted to snapable multi-package array substrate 413 using a flip chip interconnection. In this embodiment (not shown), second surface 436 of IC chip 430A, 430B or 430C is placed adjacent second surface 418 of snapable multi-package array substrate 413 and bonding pads 438 are electrically connected to metallizations 422 directly, for example by solder. An under fill material is then applied to fill the space fabricated in a snapable multi-package array 400 (FIG. 4G). Individual packaged electronic components 410A, 410B, 410C (FIG. 4E) are singulated from snapable multi-package array 400 (FIG. 4G) of the invention by simply applying hand pressure to break or "snap" individual packaged electronic components apart (FIG. 5A, FIG. 5B and FIG. 5C).

The singulation process using the method and structure of the invention does not require any specialized equipment and does not require any skilled operators. Thus, using the method and structure of the invention, singulation can be performed anywhere and packaged electronic components can be shipped in snapable multi-package arrays, stored in snapable multi-package arrays for long periods of time, and then be singulated and assembled directly into the systems, at the assembly site, without significant further processing of the snapable packaged electronic components.

In addition, the waste associated with prior art singulation methods is eliminated and more packaged electronic components can be formed on each snapable multi-package array. Also, since the singulation process using the method and structure of the invention does not involve a saw, there are no alignment problems or stresses associated with sawing and no particulates of debris are created. As a result, no washing is required, as was necessitated by prior art methods, and there is no associated tarnish of solder balls or need for de-ionized water or solvents. Consequently, using the method and structure of the invention, there is less chance to contaminate the packaged electronic components.

FIG. 4A is an enlarged top plan view of a snapable multi-package array substrate 413 in accordance with the invention. Snapable multi-package array substrate 413 is created by cutting or forming various provided substrate materials (discussed in more detail below) to the desired dimensions, i.e. length 404, width 402 and thickness 469. In FIG. 4A, snapable multi-package array substrate 413 includes a first surface 420 with a plurality of trenches 456 oriented in the vertical direction, as well as a plurality of trenches 458 oriented in the horizontal direction. Snapable multi-package array substrate 413 also has an associated length 404 and width 402. In one embodiment, length 404 is in the range of approximately two inches and width 402 is in the range of approximately two inches. Trenches 456 and 458 also have an associated base width 460, discussed in more detail below. In one embodiment of the invention, base width 460 is on the order of one to two mils.

In one embodiment, snapable multi-package array substrate 413 is formed of well-known materials such as a standard ceramic material or a glass material and could be a high temperature co-fired ceramic material or a low temperature co-fired ceramic material. High temperature and low temperature co-fired processes are well known in the art. Typically, high temperature co-fired processes are processes performed at temperatures of 1750 degrees Celsius or greater and low temperature co-fired processes are performed at between 750 and 950 degrees Celsius. High temperature co-fired materials are typically ninety percent or more alumina.

In other embodiments, snapable multi-package array substrate 413 is a silicon wafer or any one of a number of like substrate materials known to those of skill in the art.

In one embodiment, trenches 456 and 458 are scored into snapable multi-package array substrate 413 by methods well known to those of skill in the art. Typically, trenches 456 and 458 are scored into snapable multi-package array substrate 413 before snapable multi-package array substrate 413 is fired. In one embodiment, trenches 456 and 458 are formed by hand with a knife or other tool. In other embodiments, trenches 456 and 458 are formed by various automated and semi-automated methods know to those of skill in the art. In still other embodiments, trenches 456 and 458 are formed by laser or chemical etching.

Trenches 456 and 458 define the sections 412 where each individual packaged electronic component is to be formed, for clarity, in FIG. 4A, only four sections 412, 412A, 412B and 412C are labeled. Each section 412 has an associated length 408 and width 406. In one embodiment, section length 408 is in the range of approximately one mil to two inches and section width 406 is in the range of approximately one mil to two inches.

Figure 1A:
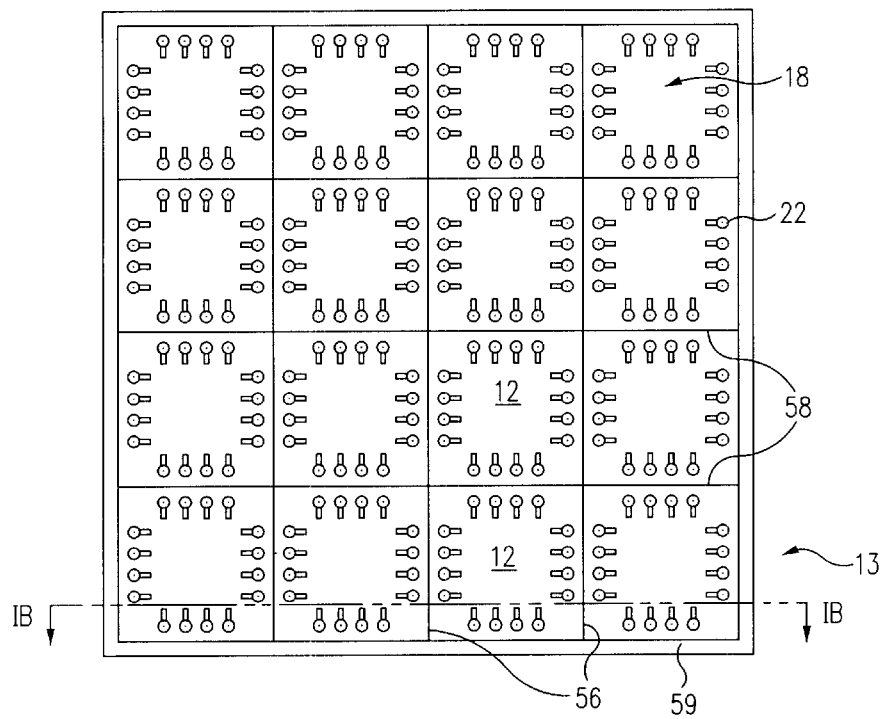
FIG. 1A is an enlarged top plan view of a prior art multi-package array substrate.
Figure 1B:
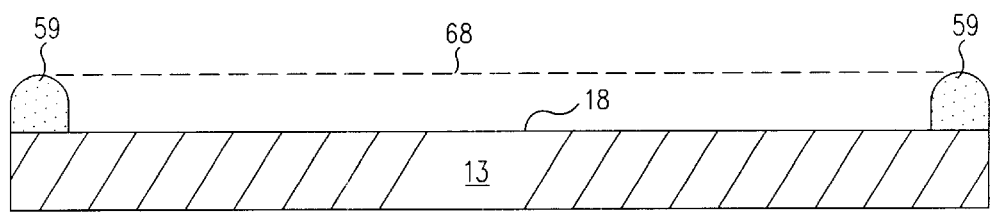
FIG. 1B is an enlarged cross-sectional view along the line IB—IB of FIG. 1A of a prior art multi-package array substrate.
Figure 2A:
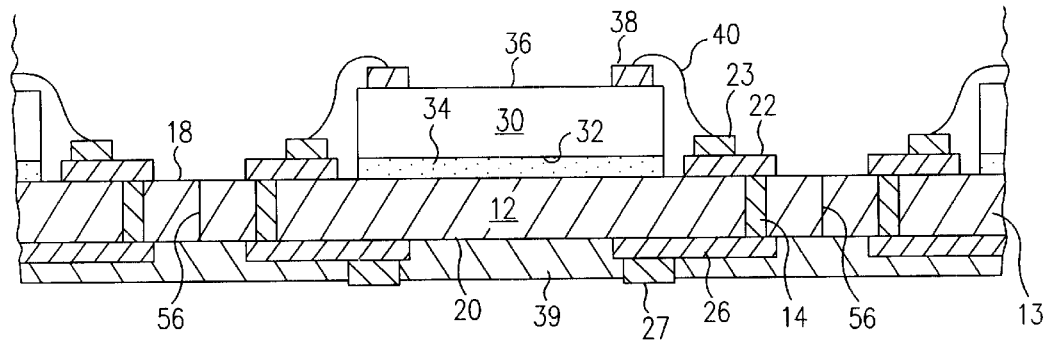
FIG. 2A is an enlarged cross-sectional view of an exemplary section of the prior art multi-package array substrate of FIG. 1A further along in processing.
Figure 2B:
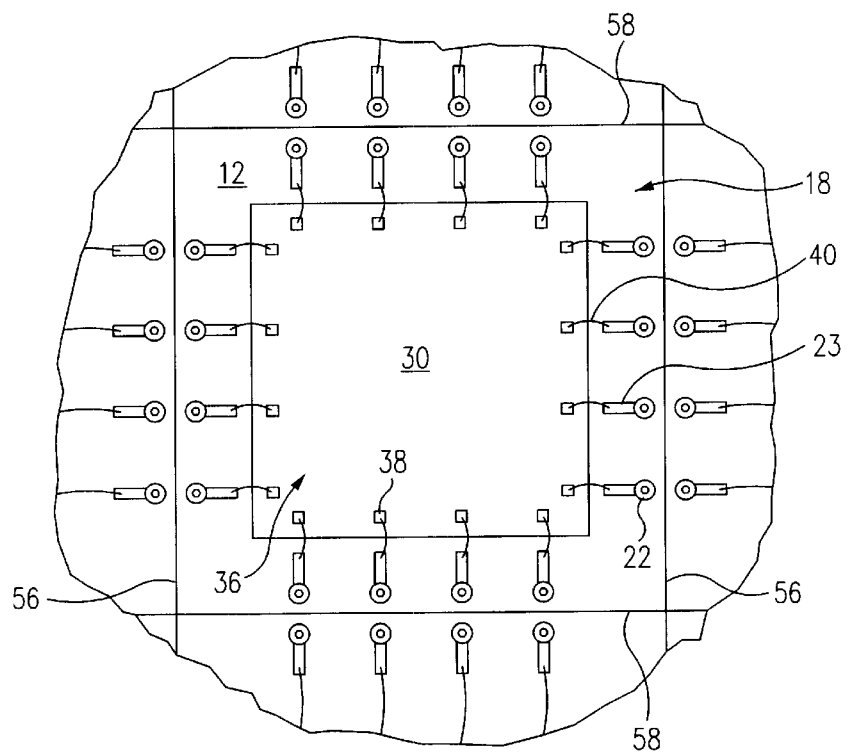
FIG. 2B is an enlarged top plan view of an exemplary section of the prior art multi-package array substrate of FIG. 1A further along in processing.
Figure 2C:
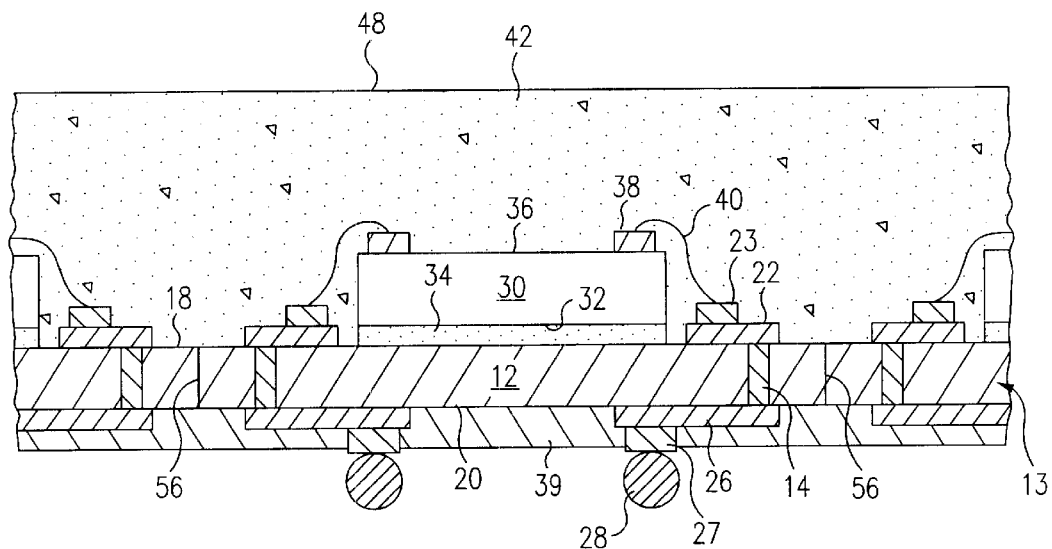
FIG. 2C is an enlarged cross-sectional view of the exemplary section of the prior art multi-package array substrate of FIG. 2A further along in processing.
Figure 2D:
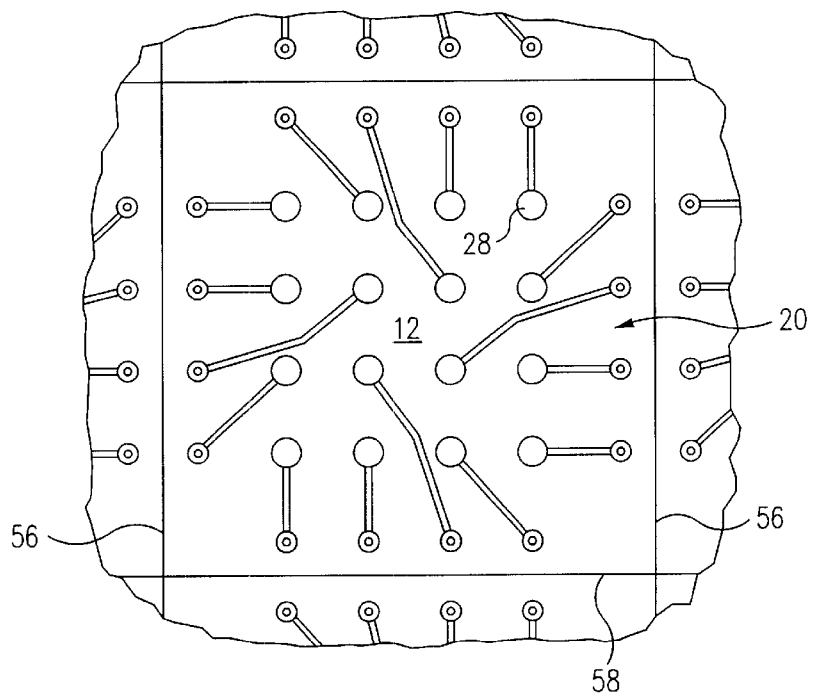
FIG. 2D is an enlarged bottom plan view of a portion of an underside surface of the exemplary section of the prior art multi-package array substrate of FIG. 2C.
Figure 2E:
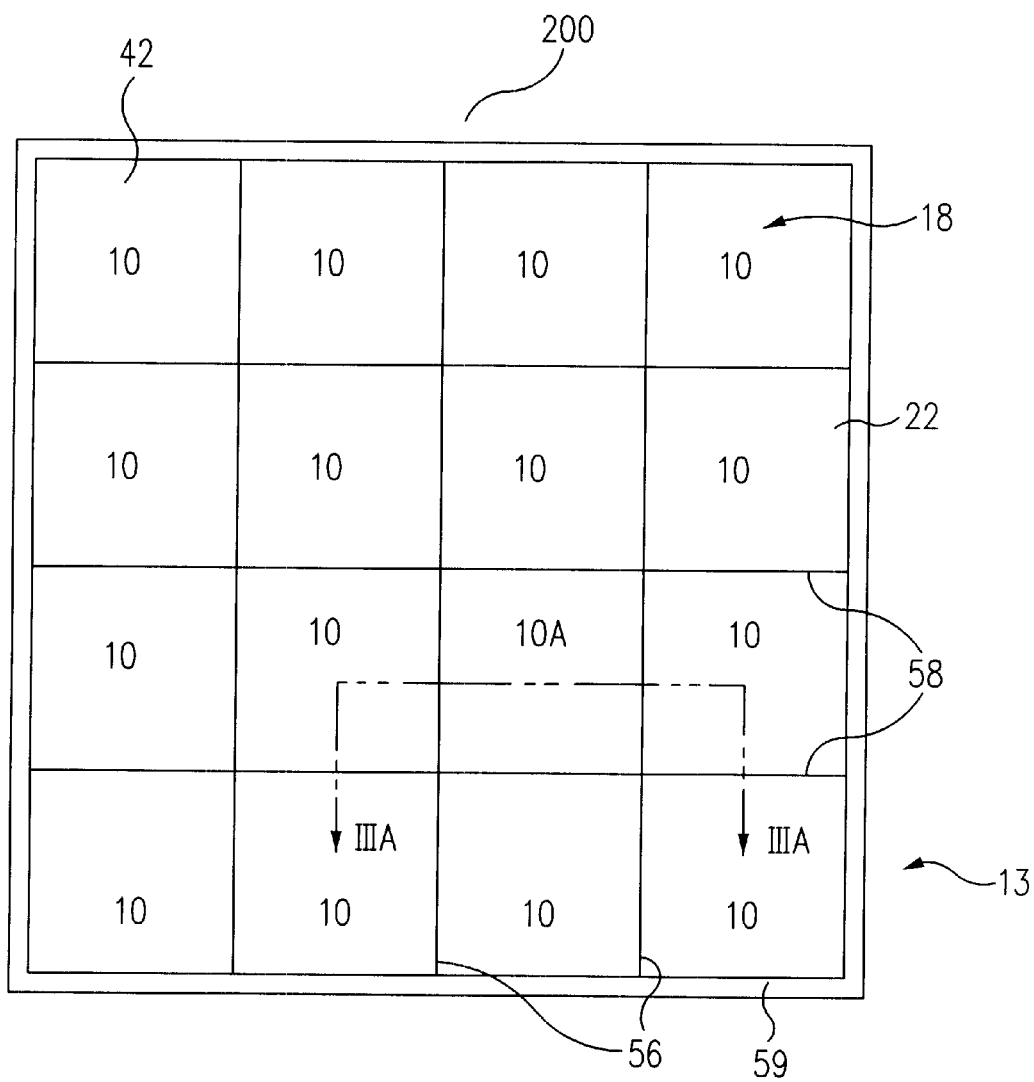
FIG. 2E is an enlarged top plan view of a prior art multi-package array.

As also shown in FIG. 4A, a dam 459 is typically formed on a second surface 418 of snapable multi-package array substrate 413, around the perimeter of snapable multi-package array substrate 413. Dam 459 is similar to dam 59 discussed above (FIG. 1A) and encloses sections 412, yet does not extend into any of the sections 412.

FIG. 4B is a cross-sectional view along the line IVB—IVB of FIG. 4A of snapable multi-package array substrate 413. FIG. 4B includes sections 412A, 412B and 412C of snapable multi-package array substrate 413. In practice, snapable multi-package array substrate 413 would also include conductive through-holes and other features, which are not illustrated in FIG. 4B to avoid detracting from the invention. As shown in FIG. 4B, dam 459 extends from second surface 418 to a predetermined height indicated by dashed line 468 above second surface 418 thereby defining a pocket which can be filled with encapsulant as described in more detail between IC chips 430A, 430B and 430C and sections 412A, 412B or 412C and also to encapsulate the flip chip interconnection between bonding pads 438 and metallizations 422.

Also shown in FIG. 4C are trenches 456 separating sections 412A, 412B and 412C.

Figure 4D:
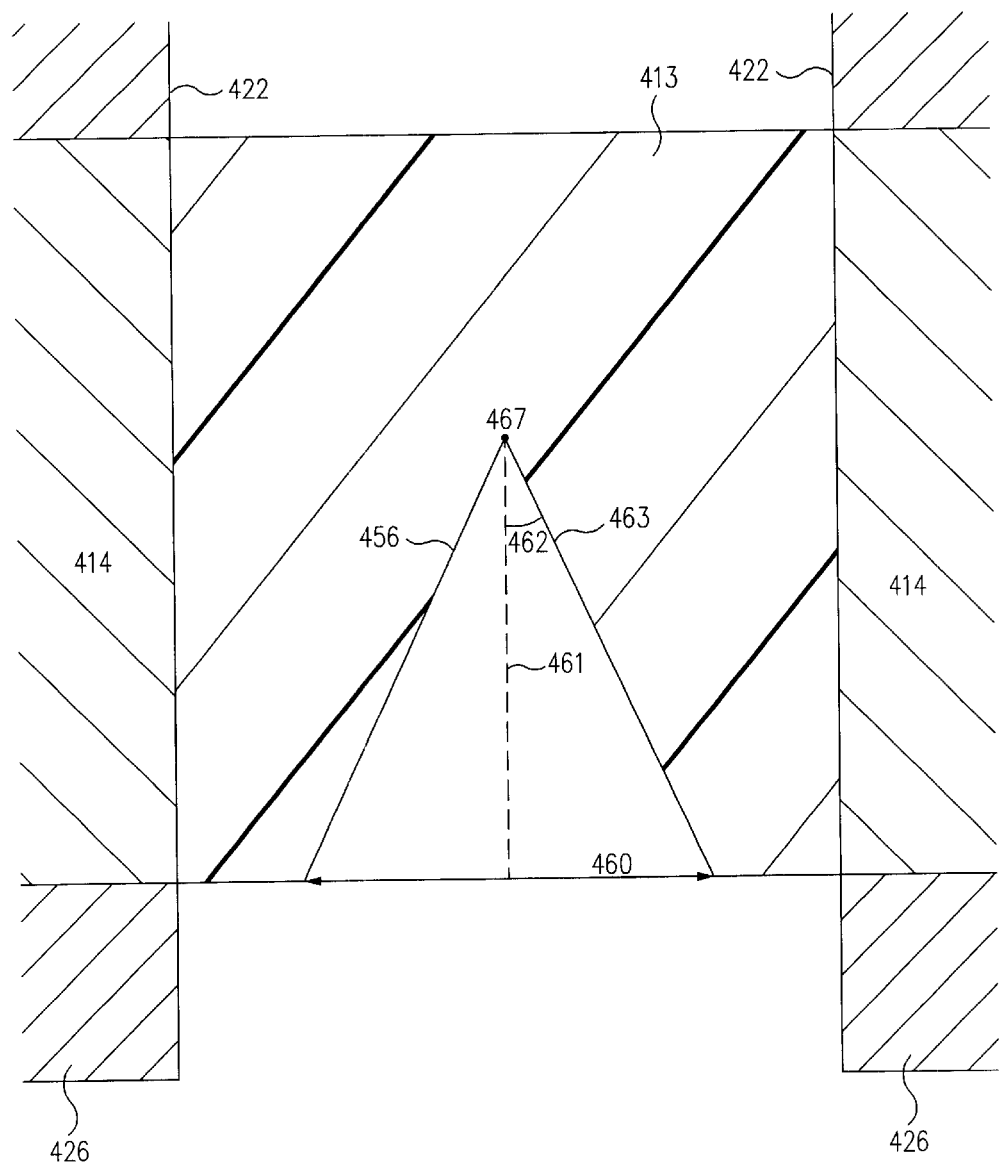
FIG. 4D is an enlargement of a portion of FIG. 4C showing detail of the metallizations, the electrically conductive vias, the snapable multi-package array substrate, and a trench in accordance with the invention.

FIG. 4D is an enlargement of portion 456 in FIG. 4C showing detail of metallizations 422 and 426, electrically conductive vias 414, snapable multi-package array substrate 413, and trench 456 including: base width 460; apex point 467; side 463; line 461; and angle 462.

Figure 4E:
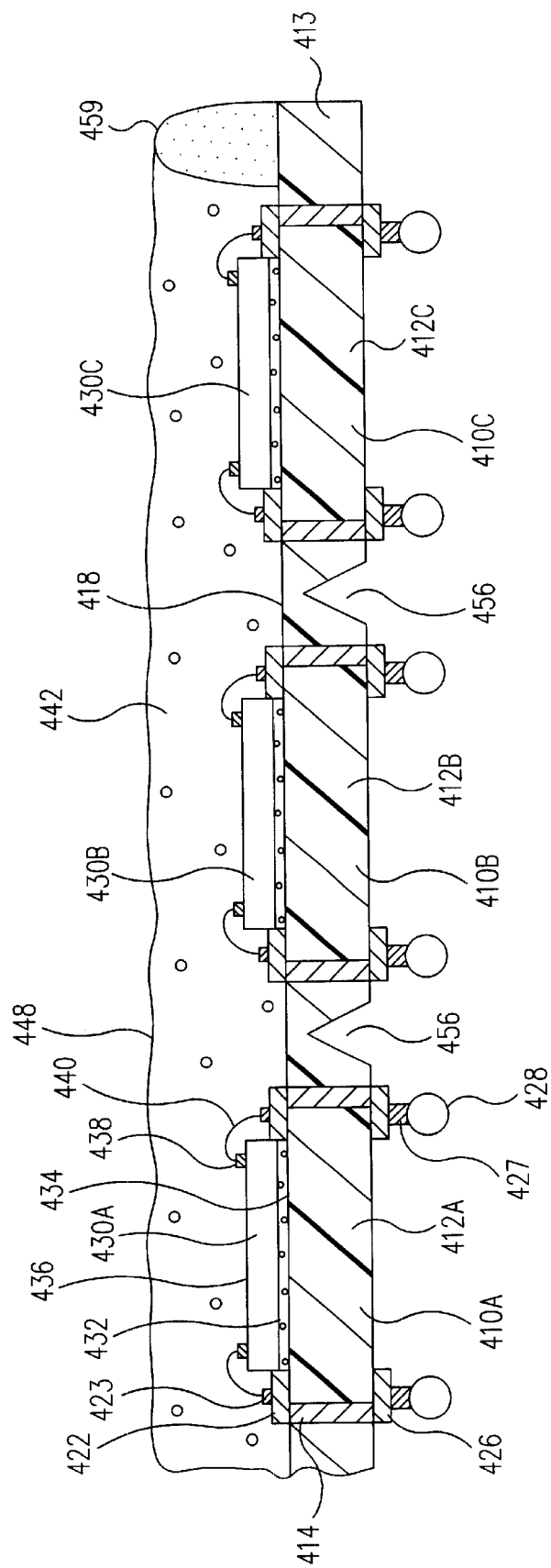
FIG. 4E shows an enlarged cross-sectional view of the three sections of the snapable multi-package array substrate of FIG. 4C further along in processing including a layer of encapsulant in accordance with the invention.
Figure 5A:
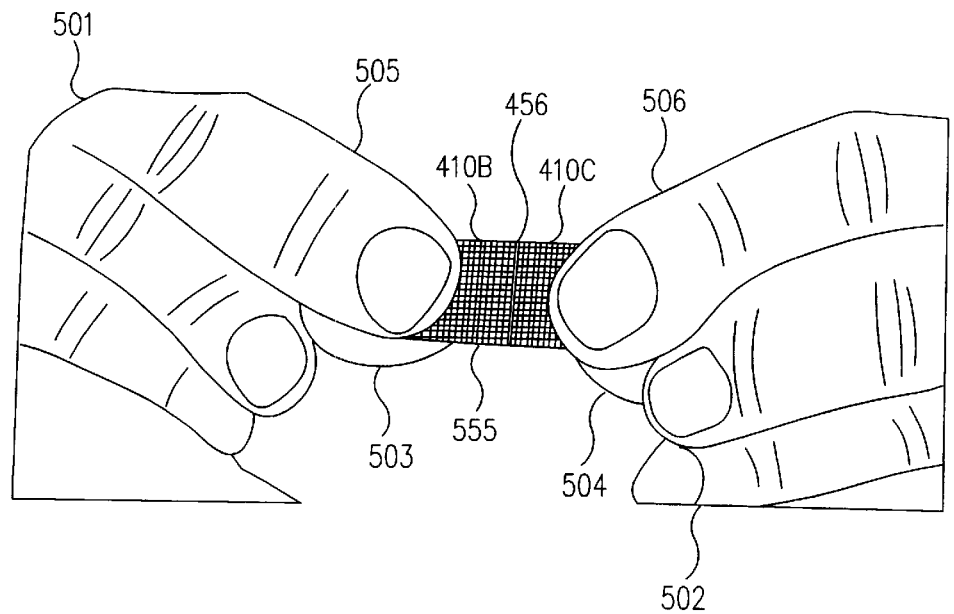
FIG. 5A shows two sections of a snapable multi-package array of the present invention being snapped apart in accordance with the present invention.
Figure 5B:
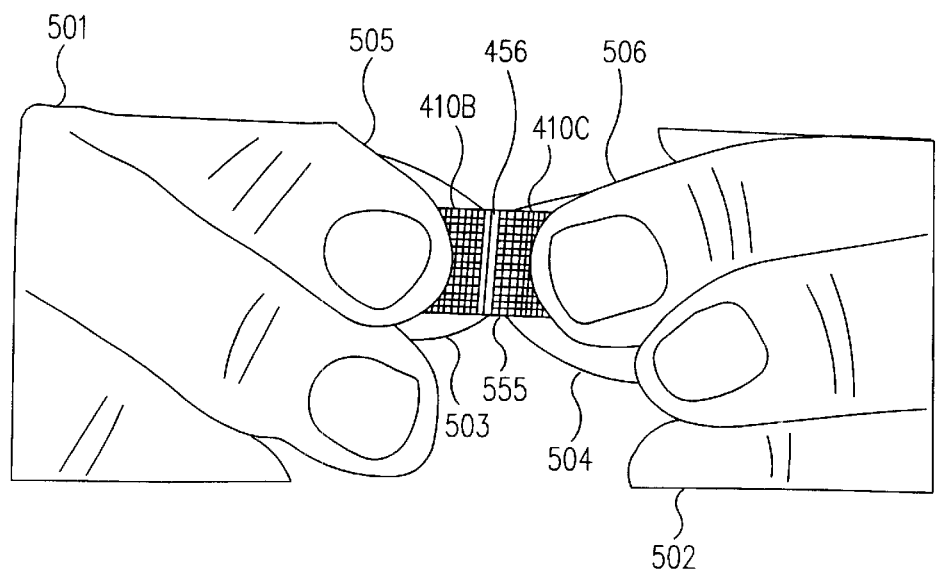
FIG. 5B shows two sections of a snapable multi-package array of the present invention being snapped apart in accordance with the invention.
Figure 5C:
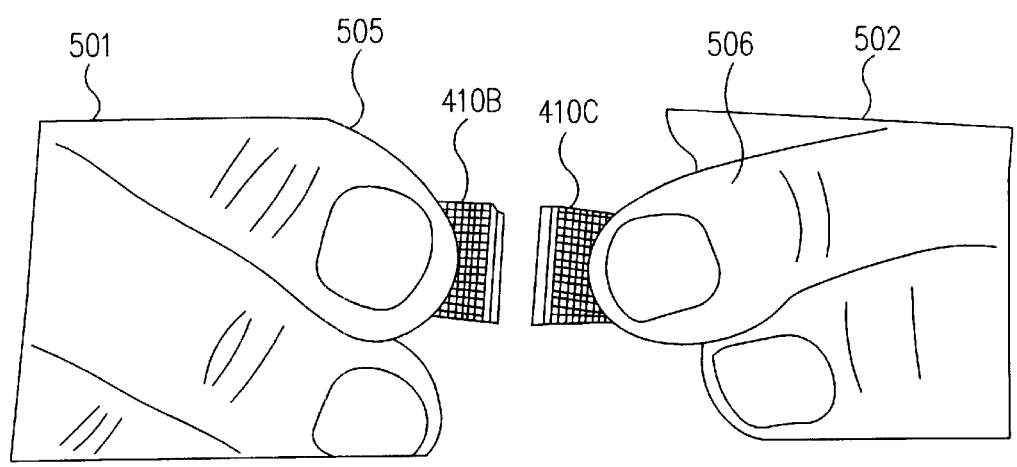
FIG. 5C shows two sections of a snapable multi-package array of the present invention being snapped apart in accordance with the invention.

As shown in FIG. 4E, a layer of snapable encapsulant 442 is applied over the entire assembly. In particular, layer of encapsulant 442 covers IC chips 430A, 430B and 430C including bonding pads 438, bond wires 440, contacts 423, metallizations 422, 426 and the remaining exposed second surface 418 of snapable multi-package array substrate 413. Typically, layer of encapsulant 442 is formed of an electrically insulating encapsulant and is applied as a liquid and then dries, or is cured, to a hardened solid.

In one embodiment, layer of encapsulant 442 comprises snapable encapsulant produced by the Dexter Hysol corporation, Semiconductor Liquid Encapsulant Division, 15051 East Don Julian Road, Industry, Calif., 91746, Telephone: (626) 968-6511, which is sold under the product numbers: FP 4450; FP4423; FP4452 FP4323 or FP4623. In another embodiment, a breakable encapsulant from Kyocera Incorporated, American Operations Division, 8611 Balboa Avenue, San Diego, Calif., 92123-1580, Telephone: (858) 576-2600 could be used. In one embodiment product number FP4623 from Dexter Hysol is preferred due to its straight line breaking or "snapping" properties and ease of application. In addition, numerous other encapsulant materials from several other manufacturers are well known and would also perform adequately with the present invention.

Referring back to FIGS. 4A and 4B, and in particular to FIG. 4B, layer of encapsulant 442 is applied by filling the pocket defined by dam 459 with encapsulant. Dam 459 prevents layer of encapsulant 442 from flowing off second surface 418 of snapable multi-package array substrate 413. Typically, dam 459 has a height indicated by dashed line 468 above second surface 418 greater than or equal to the height of upper surface 448 of layer of encapsulant 442 (FIG. 4E) above second surface 418.

Figure 4F:
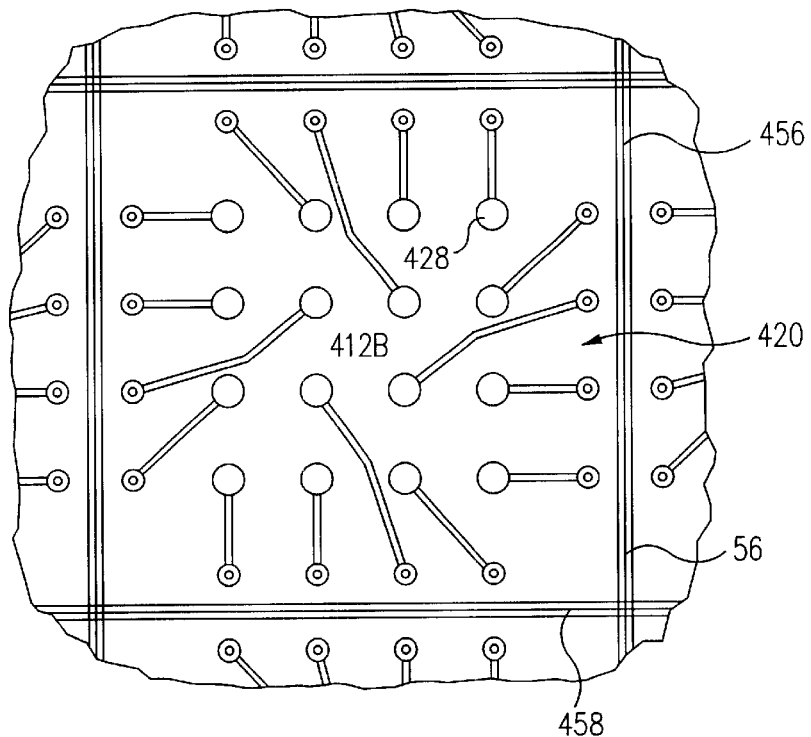
FIG. 4F is an enlarged bottom plan view of an exemplary section of snapable multi-package array substrate in accordance with the invention.
Figure 4G:
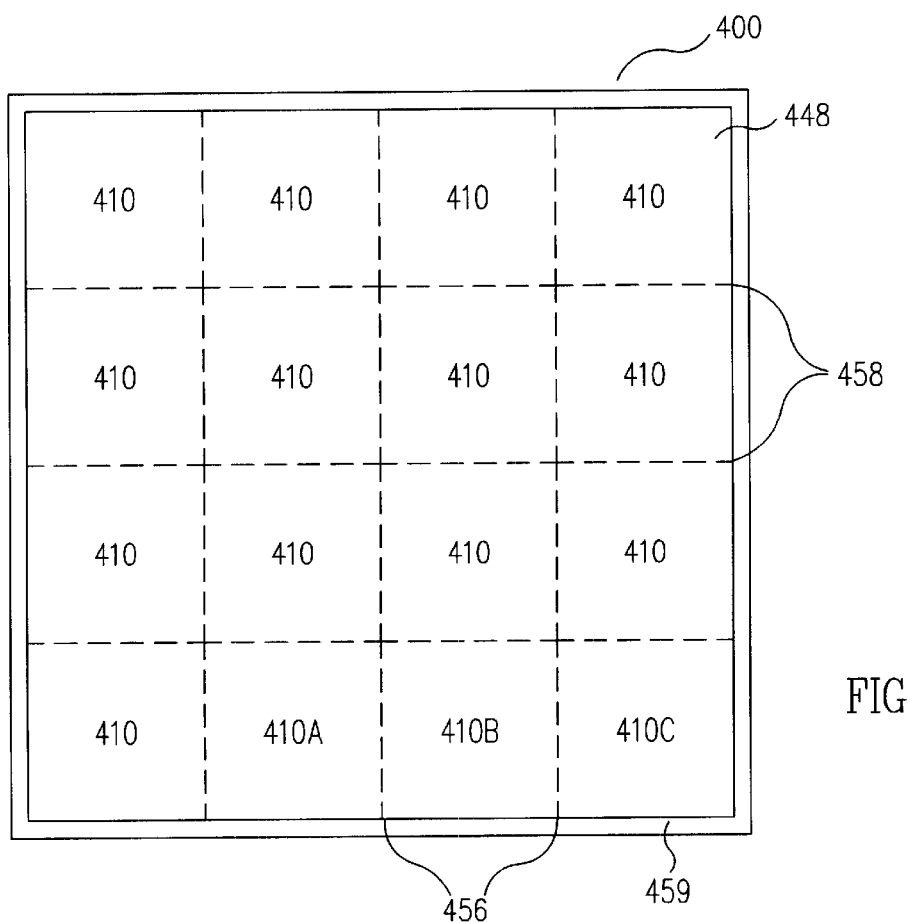
FIG. 4G is an enlarged top plan view of a snapable multi-package array in accordance with the invention.

As also shown in FIG. 4E, interconnection balls 428, typically eutectic solder balls, are attached to contacts 427 using conventional techniques. FIG. 4F is a bottom plan view of section 412B of snapable multi-package array substrate 413. As shown in FIG. 4F, interconnection balls 428 are typically arranged in an array thus forming a ball grid array. In alternative embodiments (not shown), contacts 427 (FIG. 4E) form interconnection pads for electrical interconnection with other components and interconnection balls 428 are not formed. In other embodiments (not shown), the interconnection balls or pads can be arranged adjacent the perimeter of section 412B, i.e., can be arranged near trenches 456 and/or trenches 458, instead of being arranged in an array fashion as in FIG. 4F.

Once applied, layer of encapsulant 442 is left to harden. As shown in FIG. 4E and FIG. 4G, once layer of encapsulant 442 hardens, a plurality of snapable packaged electronic components 410, including packaged electronic components 410A, 410B and 410C, are created in a multi-package array 400.

FIG. 5A, FIG. 5B and FIG. 5C together show two sections of a snapable multi-package array of the present invention being snapped apart in accordance with the invention. FIG. 5A shows hands 501 and 502 of a customer (not shown) and a portion 555 of multi-package array 400, including snapable packaged electronic components 410B and 410C. Portion 555, is gripped between forefingers 505 and 506 and thumbs 503 and 504 such that snapable packaged electronic component 410B is held between right forefinger 505 and right thumb 503 while snapable packaged electronic component 410C is held between left forefinger 506 and left thumb 504. Then outward, i.e. out of the page, pressure is exerted by thumbs 503 and 504 that, in turn, puts opposing pressures on trench 456 between packaged electronic components 410B and 410C.

In one embodiment, the pressure exerted by thumb 504 on packaged electronic component 410C, out of the page in FIG. 5A, causes side 463 (FIG. 4D) to move counterclockwise, thereby increasing angle 462 between side 463 and line 461. At the same time, the pressure exerted by thumb 503 on packaged electronic component 410B, out of the page in FIG. 5A, causes side 456 (FIG. 4D) to move clockwise. The result is that base width 460 widens until a break occurs at apex point 467 and extends into and trough snapable multi-package array substrate 413 and layer of encapsulant 442 (FIG. 4E) to surface 448 of layer of encapsulant 442, thereby "snapping" apart and singulating packaged electronic components 410B and 410C.

As shown in FIG. 5B when this pressure is exerted on trench 456, snapable packaged electronic components 410B and 410C break or "snap" apart along trench 456. Consequently, snapable packaged electronic components 410B and 410C are singulated as shown in FIG. 5C.

The ease and simplicity of the singulation process using the method and structure of the invention is in stark contrast to the prior art sigulation process discussed above which is extremely complicated, labor intensive and difficult to perform correctly.

The singulation process using the method and structure of the invention does not require any specialized equipment such as optical alignment devices, specialized saws and saw controls or pick and place machines. The singulation process using the method and structure of the invention also does not require skilled operators. Consequently, singulation, using the method and structure of the invention, can be performed anywhere. Thus, packaged electronic components can be shipped in snapable multi-package arrays, stored in snapable multi-package arrays for long periods of time, and then be singulated and assembled directly into the systems, at the assembly site, without significant further processing of the snapable packaged electronic components.

Figure 3A:
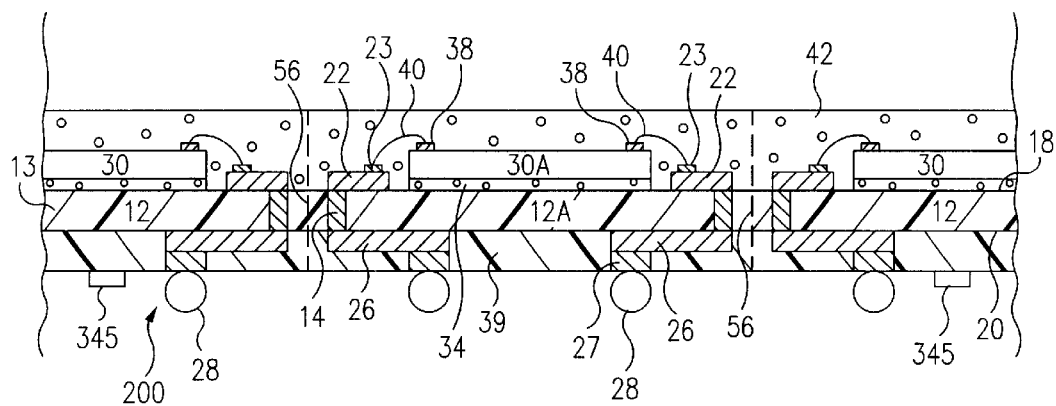
FIG. 3A is an enlarged cross-sectional view of a prior art multi-package array as would be seen looking along line IIIA—IIIA of FIG. 2E.
Figure 3B:
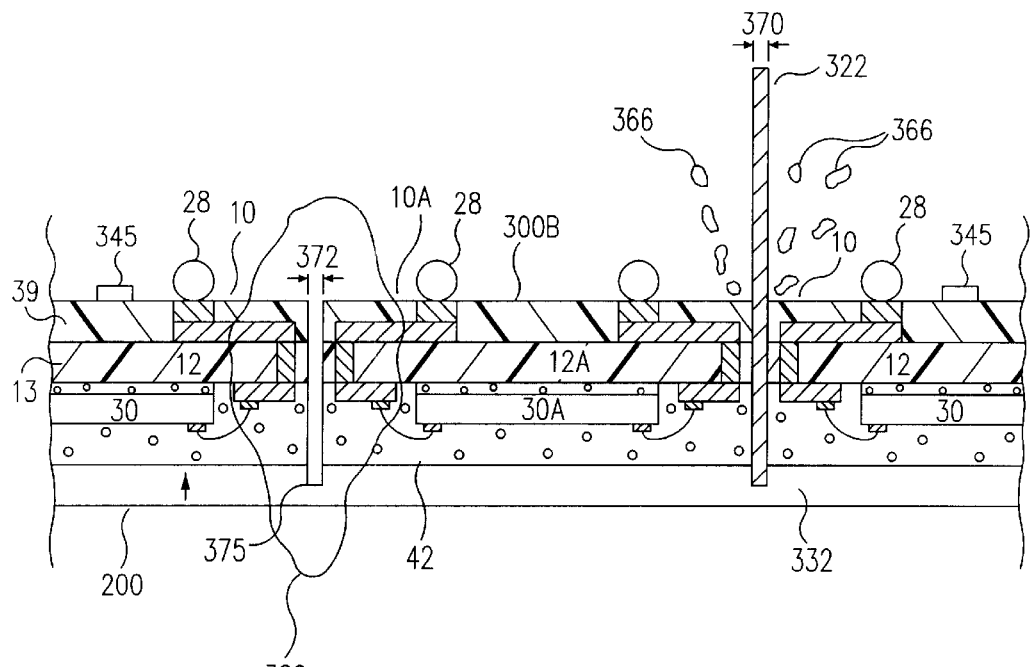
FIG. 3B is an enlarged cross-sectional view of the prior art multi-package array of FIG. 2E and FIG. 3A being cut from a backside surface.
Figure 3C:
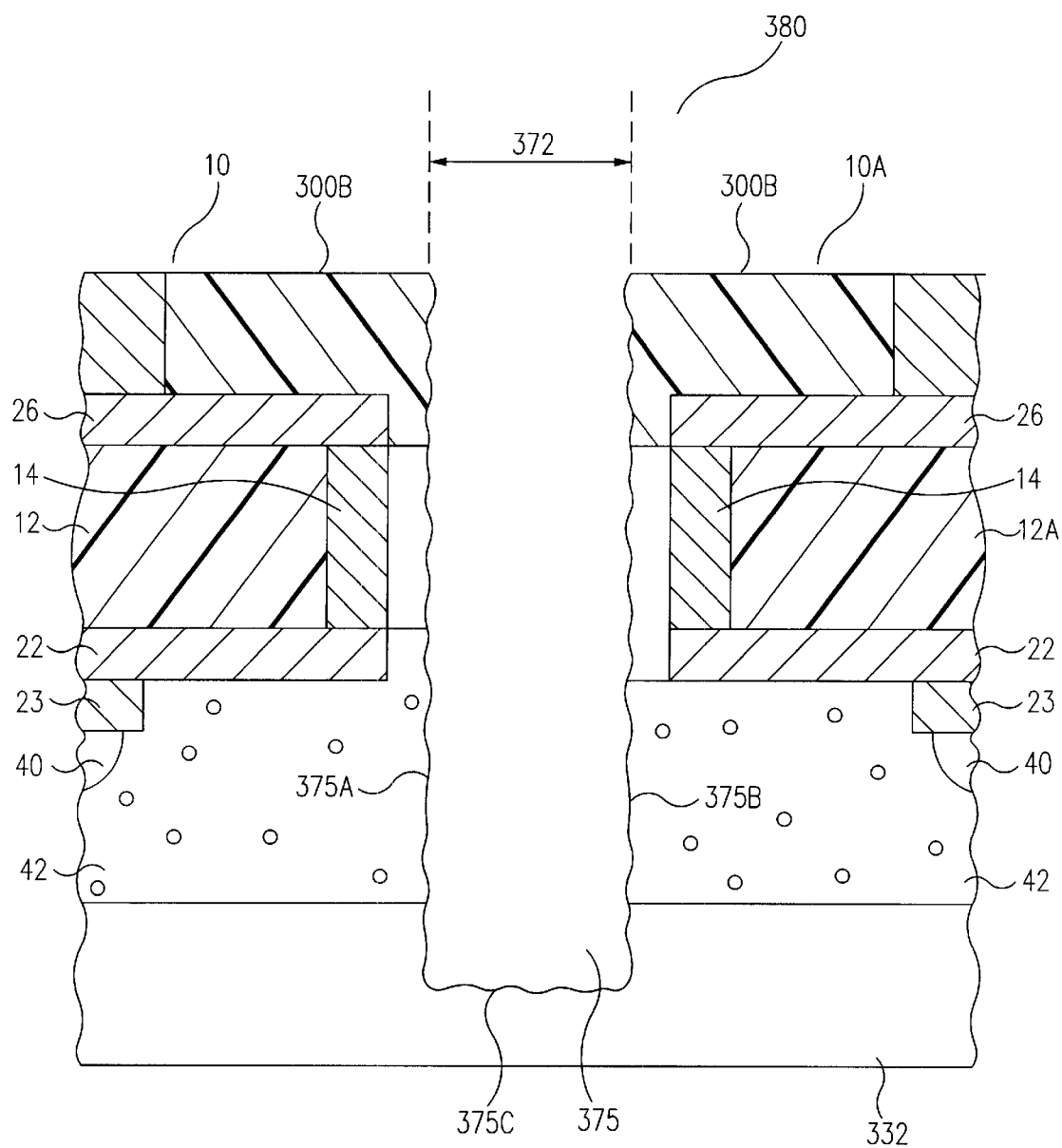
FIG. 3C is an enlarged cross-sectional view of a section of FIG. 3B showing a kerf left by the prior art singulation process.

In addition, the waste associated with prior art singulation methods is eliminated. With no saw or saw blade, and no cuts or kerfs completely through the substrate and layer of encapsulant, there is no concern about saw blade thickness and kerf or kerf thickness. Consequently, no space must be left between packaged electronic components on snapable multi-package array to allow room for cutting and the resulting kerfs. This means more packaged electronic components can be formed on each snapable multi-package array and the cost of each packaged electronic component is decreased In addition, using the method and structure of the invention for singulation, no blue tape is required and no material is lost because there are no kerfs cut completely through the substrate and encapsulant by a saw blade. Thus, the cost of blue tape is saved and an amount of material equal to kerf thickness 372 (FIG. 3C) times the length (not shown) of kerf 375 is saved. Since, as discussed above, each packaged electronic component is typically cut on all four sides using prior art methods, the amount of material saved using the method and structure of the invention is considerable.

In addition, since the singulation process using the method and structure of the invention does not involve a saw, there are no alignment problems or stresses associated with sawing and no particulates of debris are created. As a result, no washing is required, as was necessitated by prior art methods, and there is no associated tarnish of solder balls 428. In addition, no de-ionized water or solvents are required. Consequently, using the method and structure of the invention, there is less chance to contaminate the packaged electronic components.

Figure 6:
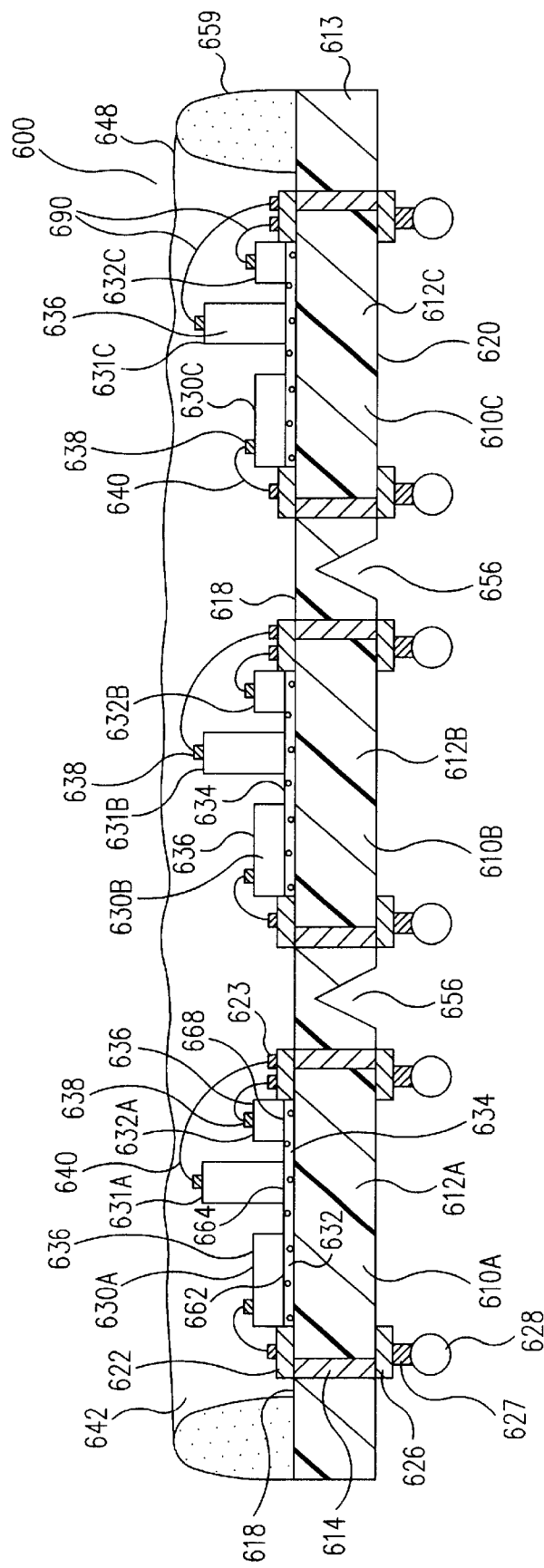
FIG. 6 shows an enlarged cross-sectional view of a snapable multi-component, multi-package array in accordance with a second embodiment of the invention.

FIG. 6 shows an enlarged cross-sectional view of a snapable multi-component, multi-package array 600 in accordance with a second embodiment of the invention. Snapable multi-component, multi-package array 600 includes multi-component packages 610A, 610B and 610C. As shown in FIG. 6, the first surfaces 662, 664 and 668 of electronic components 630A, 631A and 632A, are mounted to second surface 618 of snapable multi-package array substrate 912 by a layer of adhesive 634. Electronic components 630B, 631B, 632B, 630C, 631C and 632C are similarly attached to second surface 618 of snapable multi-package array substrate 613 by a layer of adhesive 634.

In FIG. 6, Electronic components 630A, 631A, 632A, 630B, 631B, 632B, 630C, 631C and 632C are any of several electronic components know in the art such as, for example, integrated circuit chips, resistors, capacitors, inductors or any other discrete or integrated components. By packaging multiple electronic components in multi-component packages 610A, 610B and 610C, multiple electronic components can be compactly and efficiently packaged and the proximity of electronic components 630A, 631A, 632A, 630B, 631B, 632B, 630C, 631C and 632C to each other significantly decreases signal delay time, heat generation and internal resistance and reactance.

Also shown in FIG. 6 are bonding pads 638 located on second surfaces 636 of electronic components 630A, 631A, 632A, 630B, 631B, 632B, 630C, 631C and 632C. As discussed above, bonding pads 638 are typically electrically connected to corresponding contacts 623 by bond wires 640, made of gold or aluminum for example, using conventional wire bonding techniques. FIG. 6 also shows electrically conductive vias 614 and first surface metallizations 626.

In accordance with the invention, snapable multi-component, multi-package array 600 includes a snapable multi-package array substrate 613 including trenches 656 separating sections 612A, 612B and 612C of snapable multi-package array substrate 613.

As shown in FIG. 6, a layer of snapable encapsulant 642 is applied over the entire assembly. In particular, layer of encapsulant 642 covers electronic components 630A, 631A, 632A, 630B, 631B, 632B, 630C, 631C and 632C including bonding pads 638, bond wires 640, contacts 623, metallizations 622 and the remaining exposed second surface 618 of snapable multi-package array substrate 613. As discussed above, layer of encapsulant 642 is typically formed of an electrically insulating encapsulant such as those produced by the Dexter Hysol Corporation, also discussed above.

As also shown in FIG. 6, interconnection balls 628, typically eutectic solder balls, are attached to contacts 627 using conventional methods.

The singulation process discussed above with respect to FIG. 5A, FIG. 5B and FIG. 5C, using the method and structure of the invention, is the same for multi-component, multi-package arrays such as snapable multi-component, multi-package array 600. Consequently, snapable multi-component, multi-package array 600 has all the advantages of multi-package array 400 discussed above. Therefore, the labor, preparation and machinery involved in the prior art singulation process, as well as the waste associated with the prior art process, are virtually eliminated using the snapable multi-component, multi-package array 600 according to the structure and method of the invention. In addition, as discussed above, the snapable multi-component, multi-package arrays formed according to the invention can be shipped and stored as arrays and then insulated in the field when needed.

This application is related to Swiss and Glenn, co-filed and commonly assigned U.S. patent application Ser. No. 09/539,311 entitled "SNAPABLE MULTI-PACKAGE SUBSTRATE AND ARRAY", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. Therefore, the scope of the invention is at least as broad as given by the following claims.

We claim:

1. A method for forming a snapable multi-package substrate comprising:

providing substrate material;

creating a substrate from said substrate material, said substrate having a first surface and a second surface, opposite said first surface, and a thickness between said substrate first surface and said substrate second surface;

forming a dam of a height on said second surface of said substrate, around a perimeter of said second surface of said substrate, said dam defining a pocket on said second surface of said substrate; and forming at least one trench in said first surface of said substrate, said at least one trench extending a depth into said substrate thickness, said at least one trench dividing said substrate into a first region and a second region.

2. The method of claim 1, wherein said substrate material is a ceramic material.

3. The method of claim 2, wherein said at least one trench is formed by scoring said first surface of said substrate.

4. The method of claim 2, wherein said at least one trench is formed using a laser to ablate portions of said first surface of said substrate.

5. The method of claim 2, wherein said at least one trench is formed by etching said first surface of said substrate.

6. The method of claim 1, wherein said substrate material is a high temperature, co-fired ceramic material.

7. The method of claim 6, wherein said at least one trench is formed by scoring said first surface of said substrate.

8. The method of claim 6, wherein said at least one trench is formed using a laser to ablate portions of said first surface of said substrate.

9. The method of claim 6, wherein said at least one trench is formed by etching said first surface of said substrate.

10. The method of claim 1, wherein said substrate material is a low temperature, co-fired ceramic material.

11. The method of claim 10, wherein said at least one trench is formed by scoring said first surface of said substrate.

12. The method of claim 10, wherein said at least one trench is formed using a laser to ablate portions of said first surface of said substrate.

13. The method of claim 10, wherein said at least one trench is formed by etching said first surface of said substrate.

14. The method of claim 1, wherein said substrate material is a glass ceramic material.

15. The method of claim 14, wherein said at least one trench is formed by scoring said first surface of said substrate.

16. The method of claim 14, wherein said at least one trench is formed using a laser to ablate portions of said first surface of said substrate.

17. The method of claim 14, wherein said at least one trench is formed by etching said first surface of said substrate.

18. The method of claim 1, wherein said substrate material is a silicon wafer material.

19. The method of claim 18, wherein said at least one trench is formed by scoring said first surface of said substrate.

20. The method of claim 18, wherein said at least one trench is formed using a laser to ablate portions of said first surface of said substrate.

21. The method of claim 18, wherein said at least one trench is formed by etching said first surface of said substrate.

22. A method for forming a snapable multi-package array comprising:
providing a substrate having a first surface and a second surface, opposite said first surface, and a thickness between said substrate first surface and said substrate second surface;
forming metallizations and contacts on at least said second surface of said substrate;
forming at least one trench in said first surface of said substrate, said at least one trench extending a depth into said substrate thickness, said at least one trench dividing said substrate into a first region and a second region;
attaching at least one electronic component to said first region of said second surface of said substrate; and
attaching at least one electronic component to said second region of said second surface of said substrate;
forming a dam of a height on said second surface of said substrate, around a perimeter of said second surface of said substrate, said dam defining a pocket on said second surface of said substrate; and
applying snapable encapsulant, said snapable encapsulant substantially filling said pocket defined by said dam on said second surface of said substrate, said snapable encapsulant covering said first and second regions, said electronic components, said metallizations and said contacts.

23. The method of claim 22, wherein at least one of said attached electronic components is an integrated circuit.

24. The method of claim 23, wherein attaching said integrated circuit further comprises:
electrically connecting said integrated circuit to said contacts and said metallizations on said second surface of said substrate with bond wires.

25. The method of claim 23, wherein attaching said integrated circuit further comprises:
electrically connecting said integrated circuit to said contacts and said metallizations on said second surface of said substrate in a flip chip configuration.

26. A method for forming a packaged electronic component comprising:
providing a substrate having a first surface and a second surface, opposite said first surface, and a substrate thickness between said substrate first surface and said substrate second surface;
forming metallizations and contacts on at least said second surface of said substrate;
forming at least one trench in said first surface of said substrate, said at least one trench extending a depth into said substrate thickness, said at least one trench dividing said substrate into a first region and a second region;
forming a dam of a height on said second surface of said substrate, around a perimeter of said second surface of said substrate including said first region and said second region, said dam defining a pocket on said second surface of said substrate;
attaching an electronic component to said first region of said second surface of said substrate;
applying snapable encapsulant, said snapable encapsulant substantially filling said pocket defined by said dam on said second surface of said substrate, said snapable encapsulant covering said substrate first region, said substrate second region, said electronic component, said metallizations and said contacts;
causing said snapable encapsulant to harden; and
applying a stress on said at least one trench between said substrate first region and said substrate second region, thereby causing said substrate first region, including said electronic component and a portion of said snapable encapsulant covering said substrate first region, to break away from said substrate second region, and a portion of said snapable encapsulant covering said substrate second region, said break being substantially along said at least one trench.

27. The method of claim 26, wherein said electronic component is an integrated circuit.

28. The method of claim 27, wherein attaching said integrated circuit further comprises:
electrically connecting said integrated circuit to said contacts and said metallizations on said second surface of said substrate with bond wires.

29. The method of claim 27, wherein attaching said integrated circuit further comprises:
electrically connecting said integrated circuit to said contacts and said metallizations on said second surface of said substrate in a flip chip configuration.

30. A method for forming a snapable multi-component, multi-package array comprising:
providing a substrate having a first surface and a second surface, opposite said first surface, and a thickness between said substrate first surface and said substrate second surface;
forming metallizations and contacts on at least said second surface of said substrate;
forming at least one trench in said first surface of said substrate, said at least one trench extending a depth into said substrate thickness, said at least one trench dividing said substrate into a first region and a second region;
attaching at least two electronic components to said first region of said second surface of said substrate; and
attaching at least one electronic component to said second region of said second surface of said substrate;
forming a dam of a height on said second surface of said substrate, around a perimeter of said second surface of said substrate, said dam defining a pocket on said second surface of said substrate; and applying snapable encapsulant, said snapable encapsulant substantially filling said pocket defined by said dam on said second surface of said substrate, said snapable encapsulant covering said first and second regions, said electronic components, said metallizations and said contacts.

31. The method of claim 30, wherein at least one of said attached electronic components is an integrated circuit.

32. The method of claim 31, wherein attaching said integrated circuit further comprises:

electrically connecting said integrated circuit to said contacts and said metallizations on said second surface of said substrate with bond wires.

33. The method of claim 31, wherein attaching said integrated circuit further comprises:

electrically connecting said integrated circuit to said contacts and said metallizations on said second surface of said substrate in a flip chip configuration.

34. A method for forming a multi-component package comprising:

providing a substrate having a first surface and a second surface, opposite said first surface, and a substrate thickness between said substrate first surface and said substrate second surface;

forming metallizations and contacts on at least said second surface of said substrate;

forming at least one trench in said first surface of said substrate, said at least one trench extending a depth into said substrate thickness, said at least one trench dividing said substrate into a first region and a second region;

forming a dam of a height on said second surface of said substrate, around a perimeter of said second surface of said substrate including said first region and said second region, said dam defining a pocket on said second surface of said substrate;

attaching at least two electronic components to said first region of said second surface of said substrate;

applying snapable encapsulant, said snapable encapsulant substantially filling said pocket defined by said dam on said second surface of said substrate, said snapable encapsulant covering said substrate first region and said substrate second region, said at least two electronic components, said metallizations and said contacts;

causing said snapable encapsulant to harden; and applying a stress on said at least one trench between said substrate first region and said substrate second region, thereby causing said substrate first region, including said at least two electronic components and a portion of said snapable encapsulant covering said substrate first region, to break away from said substrate second region and a portion of said snapable encapsulant covering said substrate second region, said break being substantially along said at least one trench.

35. The method of claim 34, wherein at least one of said at least two electronic components is an integrated circuit.

36. The method of claim 35, wherein attaching said integrated circuit further comprises:

electrically connecting said integrated circuit to said contacts and said metallizations on said second surface of said substrate with bond wires.

37. The method of claim 35, wherein attaching said integrated circuit further comprises:

electrically connecting said integrated circuit to said contacts and said metallizations on said second surface of said substrate in a flip chip configuration.

38. A method for forming a snapable multi-package array comprising:

providing a substrate comprising a first surface and a second surface, opposite said first surface, and a thickness between said substrate first surface and said substrate second surface;

forming metallizations and contacts on at least said second surface of said substrate;

forming at least one trench in said first surface of said substrate, said at least one trench extending a depth into said substrate thickness, said at least one trench dividing said substrate into a first region and a second region;

attaching an electronic component to said first region of said second surface of said substrate wherein said attached electronic component is an integrated circuit;

electrically connecting said integrated circuit to said contacts and said metallizations on said second surface of said substrate with bond wires;

attaching an electronic component to said second region of said second surface of said substrate;

forming a dam of a height on said second surface of said substrate, around a perimeter of said second surface of said Substrate, said dam defining a pocket on said second surface of said substrate; and applying snapable encapsulant, said snapable encapsulant substantially filling said pocket defined by said dam on said second surface of said substrate, said snapable encapsulant covering said first and second regions, said electronic components, said metallizations and said contacts.

39. A method for forming a snapable multi-package array comprising:

providing a substrate comprising a first surface and a second surface, opposite said first surface, and a thickness between said substrate first surface and said substrate second surface;

forming metallizations and contacts on at least said second surface of said substrate;

forming at least one trench in said first surface of said substrate, said at least one trench extending a depth into said substrate thickness, said at least one trench dividing said substrate into a first region and a second region;

attaching an electronic component to said first region of said second surface of said substrate wherein said attached electronic component is an integrated circuit and electrically connecting said integrated circuit to said contacts and said metallizations on said second surface of said substrate in a flip chip configuration;

attaching an electronic component to said second region of said second surface of said substrate;

forming a dam of a height on said second surface of said substrate, around a perimeter of said second surface of said substrate, said dam defining a pocket on said second surface of said substrate; and applying snapable encapsulant, said snapable encapsulant substantially filling said pocket defined by said dam on said second surface of said substrate, said snapable encapsulant covering said first and second regions, said electronic components, said metallizations and said contacts.

40. A method for forming a packaged electronic component comprising:
- providing a substrate comprising a first surface and a second surface, opposite said first surface, and a substrate thickness between said substrate first surface and said substrate second surface;
- forming metallizations and contacts on at least said second surface of said substrate;
- forming at least one trench in said first surface of said substrate, said at least one trench extending a depth into said substrate thickness, said at least one trench dividing said substrate into a first region and a second region;
- forming a dam of a height on said second surface of said substrate, around a perimeter of said second surface of said substrate including said first region and said second region, said dam defining a pocket on said second surface of said substrate;
- attaching an electronic component to said first region of said second surface of said substrate wherein said attached electronic component is an integrated circuit;
- electrically connecting said integrated circuit to said contacts and said metallizations on said second surface of said substrate with bond wires;
- applying snapable encapsulant, said snapable encapsulant substantially filling said pocket defined by said dam on said second surface of said substrate, said snapable encapsulant covering said substrate first region, said substrate second region, said electronic component, said metallizations and said contacts;
- causing said snapable encapsulant to harden; and
- applying a stress on said at least one trench between said substrate first region and said substrate second region, thereby causing said substrate first region, including said electronic component and a portion of said snapable encapsulant covering said substrate first region, to break away from said substrate second region, and a portion of said snapable encapsulant covering said substrate second region, said break being substantially along said at least one trench.

41. A method for forming a packaged electronic component comprising:
- providing a substrate comprising a first surface and a second surface, opposite said first surface, and a substrate thickness between said substrate first surface and said substrate second surface;
- forming metallizations and contacts on at least said second surface of said substrate;
- forming at least one trench in said first surface of said substrate, said at least one trench extending a depth into said substrate thickness, said at least one trench dividing said substrate into a first region and a second region;
- forming a dam of a height on said second surface of said substrate, around a perimeter of said second surface of said substrate including said first region and said second region, said dam defining a pocket on said second surface of said substrate;
- attaching an electronic component to said first region of said second surface of said substrate wherein said attached electronic component is an integrated circuit and electrically connecting said integrated circuit to said contacts and said metallizations on said second surface of said substrate in a flip chip configuration;
- applying snapable encapsulant, said snapable encapsulant substantially filling said pocket defined by said dam on said second surface of said substrate, said snapable encapsulant covering said substrate first region, said substrate second region, said electronic component, said metallizations and said contacts;
- causing said snapable encapsulant to harden; and
- applying a stress on said at least one trench between said substrate first region and said substrate second region, thereby causing said substrate first region, including said electronic component and a portion of said snapable encapsulant covering said substrate first region, to break away from said substrate second region, and a portion of said snapable encapsulant covering said substrate second region, said break being substantially along said at least one trench.

42. A method for forming a snapable multi-component, multi-package array comprising:
- providing a substrate comprising a first surface and a second surface, opposite said first surface, and a thickness between said substrate first surface and said substrate second surface;
- forming metallizations and contacts on at least said second surface of said substrate;
- forming at least one trench in said first surface of said substrate, said at least one trench extending a depth into said substrate thickness, said at least one trench dividing said substrate into a first region and a second region;
- attaching at least two electronic components to said first region of said second surface of said substrate wherein at least one of said two electronic components is an integrated circuit;
- electrically connecting said integrated circuit to said contacts and said metallizations on said second surface of said substrate with bond wires;
- attaching at least one electronic component to said second region of said second surface of said substrate;
- forming a dam of a height on said second surface of said substrate, around a perimeter of said second surface of said substrate, said dam defining a pocket on said second surface of said substrate; and
- applying snapable encapsulant, said snapable encapsulant substantially filling said pocket defined by said dam on said second surface of said substrate, said snapable encapsulant covering said first and second regions, said electronic components, said metallizations and said contacts.

43. A method for forming a snapable multi-component, multi-package array comprising:
- providing a substrate comprising a first surface and a second surface, opposite said first surface, and a thickness between said substrate first surface and said substrate second surface;
- forming metallizations and contacts on at least said second surface of said substrate;
- forming at least one trench in said first surface of said substrate, said at least one trench extending a depth into said substrate thickness, said at least one trench dividing said substrate into a first region and a second region;
- attaching at least two electronic components to said first region of said second surface of said substrate wherein at least one of said two electronic components is an integrated circuit and electrically connecting said integrated circuit to said contacts and said metallizations on said second surface of said substrate in a flip chip configuration;

attaching at least one electronic component to said second region of said second surface of said substrate;

forming a dam of a height on said second surface of said substrate, around a perimeter of said second surface of said substrate, said dam defining a pocket on said second surface of said substrate; and applying snapable encapsulant, said snapable encapsulant substantially filling said pocket defined by said dam on said second surface of said substrate, said snapable encapsulant covering said first and second regions, said electronic components, said metallizations and said contacts.

44. A method for forming a multi-component package comprising:

providing a substrate comprising a first surface and a second surface, opposite said first surface, and a substrate thickness between said substrate first surface and said substrate second surface;

forming metallizations and contacts on at least said second surface of said substrate;

forming at least one trench in said first surface of said substrate, said at least one trench extending a depth into said substrate thickness, said at least one trench dividing said substrate into a first region and a second region;

forming a dam of a height on said second surface of said substrate, around a perimeter of said second surface of said substrate including said first region and said second region, said dam defining a pocket on said second surface of said substrate;

attaching at least two electronic components to said first region of said second surface of said substrate wherein at least one of said at least two electronic components is an integrated circuit;

electrically connecting said integrated circuit to said contacts and said metallizations on said second surface of said substrate with bond wires;

applying snapable encapsulant, said snapable encapsulant substantially filling said pocket defined by said dam on said second surface of said substrate, said snapable encapsulant covering said substrate first region and said substrate second region, said at least two electronic components, said metallizations and said contacts;

causing said snapable encapsulant to harden; and applying a stress on said at least one trench between said substrate first region and said substrate second region, thereby causing said substrate first region, including said at least two electronic components and a portion of said snapable encapsulant covering said substrate first region, to break away from said substrate second region and a portion of said snapable encapsulant covering said substrate second region, said break being substantially along said at least one trench.

45. A method for forming a multi-component package comprising:

providing a substrate comprising a first surface and a second surface, opposite said first surface, and a substrate thickness between said substrate first surface and said substrate second surface;

forming metallizations and contacts on at least said second surface of said substrate;

forming at least one trench in said first surface of said substrate, said at least one trench extending a depth into said substrate thickness, said at least one trench dividing said substrate into a first region and a second region;

forming a dam of a height on said second surface of said substrate, around a perimeter of said second surface of said substrate including said first region and said second region, said dam defining a pocket on said second surface of said substrate;

attaching at least two electronic components to said first region of said second surface of said substrate wherein at least one of said at least two electronic components is an integrated circuit and electrically connecting said integrated circuit to said contacts and said metallizations on said second surface of said substrate in a flip chip configuration;

applying snapable encapsulant, said snapable encapsulant substantially filling said pocket defined by said dam on said second surface of said substrate, said snapable encapsulant covering said substrate first region and said substrate second region, said at least two electronic components, said metallizations and said contacts;

causing said snapable encapsulant to harden; and applying a stress on said at least one trench between said substrate first region and said substrate second region, thereby causing said substrate first region, including said at least two electronic components and a portion of said snapable encapsulant covering said substrate first region, to break away from said substrate second region and a portion of said snapable encapsulant covering said substrate second region, said break being substantially along said at least one trench.

* * * * *